(12) United States Patent
Jagannathan et al.

(10) Patent No.: US 9,754,967 B2
(45) Date of Patent: Sep. 5, 2017

(54) STRUCTURE FOR INTEGRATION OF AN III-V COMPOUND SEMICONDUCTOR ON SOI

(71) Applicant: INTERNATIONAL BUSINESS MACHINES CORPORATION, Armonk, NY (US)

(72) Inventors: Hemanth Jagannathan, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/408,053

(22) Filed: Jan. 17, 2017

(65) Prior Publication Data

US 2017/0125444 A1    May 4, 2017

Related U.S. Application Data

(62) Division of application No. 14/643,360, filed on Mar. 10, 2015, now Pat. No. 9,548,319.

(51) Int. Cl.
*H01L 21/02*    (2006.01)
*H01L 21/311*    (2006.01)
(Continued)

(52) U.S. Cl.
CPC ...... *H01L 27/1207* (2013.01); *H01L 21/0262* (2013.01); *H01L 21/02433* (2013.01);
(Continued)

(58) Field of Classification Search
CPC ......... H01L 21/02433; H01L 21/02636; H01L 21/8258; H01L 27/0922; H01L 29/267
See application file for complete search history.

(56) References Cited

U.S. PATENT DOCUMENTS 6,039,803 A    3/2000 Fitzgerald et al.
9,337,196 B2 *  5/2016 Cheng ................. H01L 27/0924
(Continued)

FOREIGN PATENT DOCUMENTS

CN    103177971 A1    6/2013

OTHER PUBLICATIONS

Fiorenza et al., "Aspect Ratio Trapping: a Unique Technology for Integrating Ge and III-Vs with Silicon CMOS", ECS Transactions, 33 (6) pp. 963-976 (2010).
(Continued)

*Primary Examiner* — Raj R Gupta
(74) *Attorney, Agent, or Firm* — Scully, Scott, Murphy & Presser, P.C.; Daniel P. Morris, Esq.

(57) ABSTRACT

A semiconductor-on-insulator (SOI) substrate is provided that includes a silicon or germanium handle substrate that is miscut from 2 degrees to 8 degrees towards the <111> crystallographic direction or the <100> crystallographic direction. The topmost semiconductor layer is removed from a portion of the SOI substrate, and then a trench having a high aspect ratio is formed within the insulator layer of the SOI substrate and along the <111> crystallographic direction or the <100> crystallographic direction. An III-V compound semiconductor pillar, which includes a lower portion that has a first defect density and an upper portion that has a second defect density that is less than the first defect density, is then formed in the trench.

18 Claims, 6 Drawing Sheets

(51) Int. Cl.

| | |
|---|---|
| H01L 21/84 | (2006.01) |
| H01L 27/092 | (2006.01) |
| H01L 29/06 | (2006.01) |
| H01L 29/267 | (2006.01) |
| H01L 27/12 | (2006.01) |
| H01L 29/04 | (2006.01) |
| H01L 29/16 | (2006.01) |
| H01L 29/20 | (2006.01) |

(52) U.S. Cl.
CPC .. *H01L 21/02538* (2013.01); *H01L 21/02609* (2013.01); *H01L 21/02639* (2013.01); *H01L 21/845* (2013.01); *H01L 27/1211* (2013.01); *H01L 29/045* (2013.01); *H01L 29/16* (2013.01); *H01L 29/20* (2013.01)

(56) References Cited

U.S. PATENT DOCUMENTS

| | | | |
|---|---|---|---|
| 2007/0228377 | A1* | 10/2007 | Wieczorek ........ H01L 21/76243 257/67 |
| 2008/0070355 | A1 | 3/2008 | Lochtefeld et al. |
| 2010/0072515 | A1 | 3/2010 | Park et al. |
| 2011/0001167 | A1 | 1/2011 | Bedell et al. |
| 2011/0049568 | A1 | 3/2011 | Lochtefeld et al. |
| 2011/0210374 | A1 | 9/2011 | Lochtefeld |
| 2012/0032234 | A1 | 2/2012 | Wang et al. |
| 2012/0199876 | A1 | 8/2012 | Bai et al. |
| 2013/0115721 | A1 | 5/2013 | Clark |
| 2013/0228864 | A1 | 9/2013 | Mieno |
| 2015/0228783 | A1* | 8/2015 | Cheng .................. H01L 29/785 257/347 |

OTHER PUBLICATIONS

Wu et al., "Atomic-layer-deposited Al2O3 /GaAs metal-oxide-semiconductor field-effect transistor on Si substrate using aspect ratio trapping technique", Applied Physics Letters 93, 242106-1 to 3 (2008).

Beeler et al., "Comparative study of InGaAs integration on bulk Ge and virtual Ge/Si (100) substrates for low-cost photovoltaic applications", Solar Energy Materials and Solar Cells, 94(12), pp. 2362-2370 (2010).

Loo et al., "Selective Area Growth of InP on On-Axis Si(001) Substrates with Low Antiphase Boundary Formation", Journal of the Electrochemical Society, 159 (3) pp. H260-H265 (2012).

Merckling et al., "Selective area growth of InP in shallow trench isolation on large scale Si(001) wafer using defect confinement technique", Journal of Applied Physics 114, 033708-1 to 6 (2013).

Paladagu et al., "Site Selective Integration of III-V Materials on Si for Nanoscale Logic and Photonic Devices", Crystal Growth & Design, 12(10), pp. 4696-4702 (2012).

List of IBM Patents or Patent Applications Treated As Related Dated Jan. 17, 2017, 2 Pages.

* cited by examiner

STRUCTURE FOR INTEGRATION OF AN III-V COMPOUND SEMICONDUCTOR ON SOI

BACKGROUND

The present application relates to a semiconductor structure and a method of forming the same. More particularly, the present application relates to a semiconductor structure including an III-V compound semiconductor pillar formed on a surface of a miscut silicon or germanium handle substrate of a semiconductor-on-insulator (SOI) substrate, and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

III-V compound semiconductor materials have a higher electron mobility than silicon and are thus an attractive channel material candidate for providing high performance nFET devices for future technology nodes. Integrating an III-V compound semiconductor material on a silicon substrate is very challenge due to the large lattice constant mismatch between the two semiconductor materials.

In view of the above, there is a need for providing a method of forming a semiconductor structure in which an III-V compound semiconductor material can be readily integrated on a silicon substrate.

SUMMARY

A semiconductor-on-insulator (SOI) substrate is provided that includes a silicon or germanium handle substrate that is miscut from 2 degrees to 8 degrees towards the <111> crystallographic direction or the <100> crystallographic direction. The topmost semiconductor layer is removed from a portion of the SOI substrate, and then a trench having a high aspect ratio is formed within the insulator layer of the SOI substrate and along the <111> crystallographic direction or the <100> crystallographic direction of the handle substrate. An III-V compound semiconductor pillar, which includes a lower portion that has a first defect density and an upper portion that has a second defect density that is less than the first defect density, is then formed in the trench.

In one aspect of the present application, a semiconductor structure is provided. In accordance with an embodiment of the present application, the semiconductor structure includes a handle substrate of silicon or germanium that is miscut from 2 degrees to 8 degrees towards the <111> crystallographic direction or the <100> crystallographic direction. An III-V compound semiconductor pillar extends upward from one region of the handle substrate, and is in direct contact with a topmost surface of the handle substrate and is surrounded by dielectric material. A top semiconductor material portion is located over another region of the handle substrate, wherein the top semiconductor material portion is separated from the handle substrate by an insulator layer.

In another aspect of the present application, a method of forming a semiconductor structure is provided. In accordance with one embodiment of the present application, the method includes providing a semiconductor-on-insulator (SOI) substrate that includes, from bottom to top, a silicon or germanium handle substrate that is miscut from 2 degrees to 8 degrees towards the <111> crystallographic direction or the <100> crystallographic direction, an insulator layer and a top semiconductor layer. Next, the top semiconductor layer is removed from one region of the SOI substrate to expose a portion of the insulator layer, while maintaining a portion of the top semiconductor layer in another region of the SOI substrate. A trench is then formed in the exposed portion of the insulator layer of the SOI substrate. An III-V compound semiconductor pillar is then epitaxially grown in the trench. In accordance with the present application, the III-V compound semiconductor pillar comprises a lower portion that has a first defect density and an upper portion that has a second defect density that is less than the first defect density.

DETAILED DESCRIPTION

Figure 1:
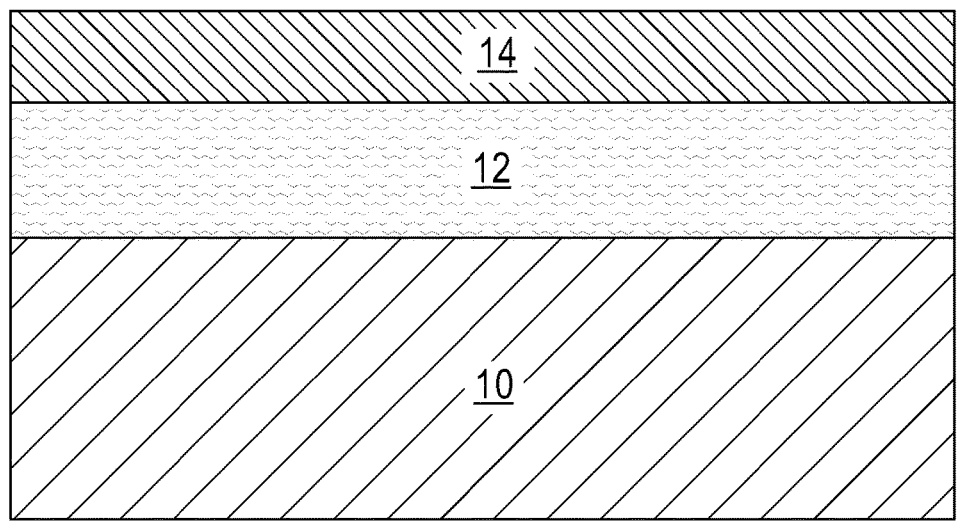
FIG. 1 is a cross sectional view of an exemplary semiconductor structure including, from bottom to top, a handle substrate, an insulator layer and a top semiconductor layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring now to FIG. 1, there is illustrated an exemplary semiconductor structure including, from bottom to top, a handle substrate 10, an insulator layer 12 and a top semiconductor layer 14 that can be employed in accordance with an embodiment of the present application. Collectively, the handle substrate 10, the insulator layer 12 and the top semiconductor layer 14 provide a semiconductor-on-insulator (SOI) substrate. The handle substrate 10 provides mechanical support for the insulator layer 12 and the top semiconductor layer 14.

The handle substrate 10 that can be used in the present application comprises a miscut semiconductor material selected from silicon (Si) and germanium (Ge). By "miscut" it is meant that the semiconductor material that is employed as the handle substrate 10 is from 2 degrees to 8 degrees towards either the <111> crystallographic direction or the <110> crystallographic direction. In another embodiment, the miscut is from 4 degrees to 6 degrees towards the either the <111> crystallographic direction or the <110> crystallographic direction. The miscut semiconductor material that provides the handle substrate 10 forms terraces on the surface of the semiconductor material that provides the handle substrate 10. The semiconductor material that provides the handle substrate 10 may be crystalline. Typically, crystalline Si or crystalline Ge is employed as the semiconductor material of the handle substrate 10. The crystal orientation of the handle substrate 10 may be {100} or {110}. The thickness of the handle substrate 10 can be from 30 microns to 2 mm, although lesser and greater thicknesses can also be employed.

The insulator layer 12 may be a crystalline or non-crystalline oxide or nitride. In one embodiment, the insulator layer 12 is an oxide such as, for example, silicon dioxide. In another embodiment, the insulator layer 12 may comprise a nitride such as, for example, silicon nitride or boron nitride. In yet another embodiment, the insulator layer 12 may comprise a material stack of an oxide and nitride. In one example, the insulator layer 12 may include a material stack of silicon dioxide and boron nitride. The thickness of the insulator layer 12 can be from 10 nm to 200 nm, although lesser and greater thicknesses can also be employed.

The top semiconductor layer 14 may include any semiconductor material such as, for example, Si, Ge, SiGe, SiC, SiGeC, and III/V compound semiconductors such as, for example, InAs, GaAs, or InP. Multilayers of these semiconductor materials can also be used as the semiconductor material of the top semiconductor layer 14. In one embodiment, the top semiconductor layer 14 and the handle substrate 10 comprise a same semiconductor material. In one example, the top semiconductor layer 14 and the handle substrate 10 both comprise Si or Ge. In another embodiment, the top semiconductor layer 14 and the handle substrate 10 comprise different semiconductor materials. In one example, the top semiconductor layer 14 comprises an III-V compound semiconductor material, while the handle substrate 10 comprises Si or Ge. In another example, the top semiconductor layer 14 comprises Ge, while the handle substrate 10 comprises Si. In yet a further example, the top semiconductor layer 14 comprises Si, while the handle substrate 10 comprises Ge.

The top semiconductor layer 14 may be a single crystalline semiconductor material, a polycrystalline semiconductor material, or an amorphous semiconductor material. Typically, the top semiconductor material 14 is a single crystalline semiconductor material such as, for example, single crystalline Si. In some embodiments, the top semiconductor layer 14 may have a same or different crystal orientation than the handle substrate 10. The thickness of the top semiconductor layer 14 can be from 10 nm to 200 nm, although lesser and greater thicknesses can also be employed.

The SOI substrate (10, 12, 14) may be formed utilizing standard processes including for example, SIMOX (separation by ion implantation of oxygen) or layer transfer. When a layer transfer process is employed, an optional thinning step such as, for example, a planarization process and/or an etch back process, may follow the bonding of two semiconductor wafers together. The optional thinning step reduces the thickness of the top semiconductor layer 14 to a layer having a thickness that is more desirable.

Figure 2:
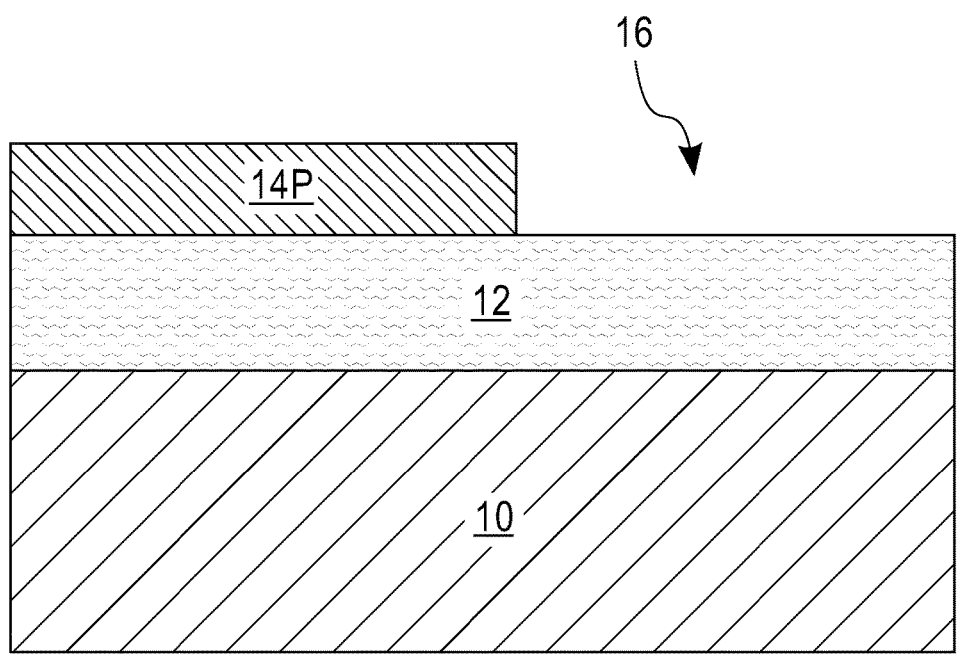
FIG. 2 is a cross sectional view of the exemplary semiconductor structure of FIG. 1 after removing the top semiconductor layer from above a portion of the insulator layer, while leaving a semiconductor material portion of the top semiconductor layer above another portion of the insulator layer.

Referring now to FIG. 2, there is illustrated the exemplary semiconductor structure of FIG. 1 after removing the top semiconductor layer 14 from above a portion of the insulator layer 12, while leaving a semiconductor material portion 14P of the top semiconductor layer 14 above another portion of the insulator layer 12. An opening 16 is provided in the exemplary semiconductor structure that exposes a topmost surface of the insulator layer 12 in one region of the SOI substrate. Although a single opening 16 and a single semiconductor material portion 14P are described and illustrated, a plurality of openings 16 and semiconductor material portions 14P can be formed. In such an embodiment, each semiconductor portion 14P is separated from one another by an opening 16 that exposes the topmost surface of the insulator layer 12.

The removal of the topmost semiconductor layer 14 from above one portion of the insulator layer 14 includes patterning the top semiconductor layer 14. In one embodiment of the present application, the patterning of the top semiconductor layer 14 may include lithography and etching. The lithographic step may include forming a photoresist material (not shown) atop the top semiconductor layer 14, exposing the photoresist to a desired pattern of irradiation, and developing the photoresist material utilizing a conventional resist developer. Etching may include dry etching and/or wet etching. Dry etching includes reactive ion etching, plasma etching, ion bean etching or laser ablation. Wet etching includes a chemical etchant that is selective in removing exposed portions of the insulator layer 12. The patterned photoresist can be removed from the structure anytime after pattern transfer utilizing a conventional photoresist removal process such as, for example, ashing. In some embodiments, and as shown, an anisotropic etch is used so as to provide a semiconductor material portion 14P that has a vertical sidewall. In another embodiment (not shown), an isotropic etch can be used so as to provide a semiconductor material portion 14P that provides a non-vertical sidewall.

Figure 3:
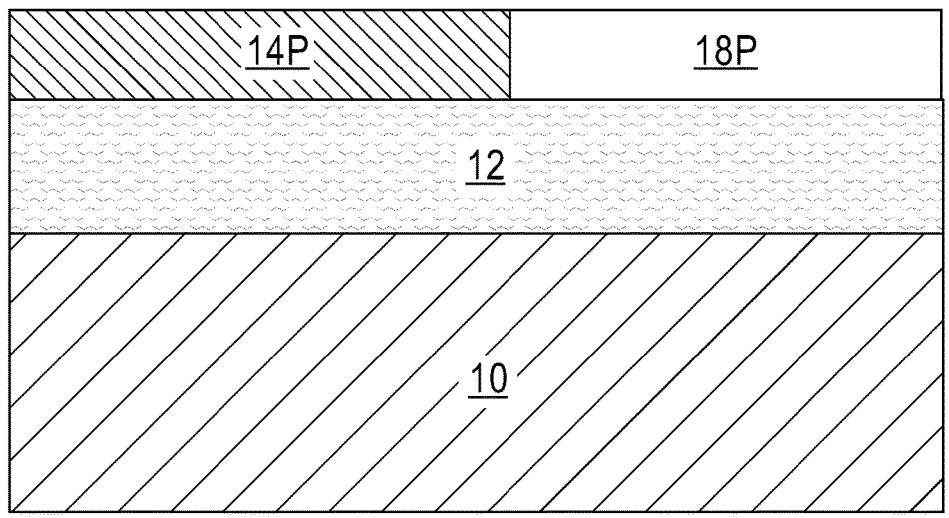
FIG. 3 is a cross sectional view of the exemplary semiconductor structure of FIG. 2 after forming a dielectric material portion on a portion of the insulator layer not covered with the semiconductor material portion.

Referring now to FIG. 3, there is illustrated the exemplary semiconductor structure of FIG. 2 after forming a dielectric material portion 18P on the exposed surface of insulator layer 12 not covered with the semiconductor material portion 14P. As is shown, the dielectric material portion 18P has a sidewall surface that directly contacts a sidewall surface of the semiconductor material portion 14P and a bottommost surface that directly contacts a topmost surface of insulator layer 12. In some embodiments, and as shown, the dielectric material portion 18P also has a topmost surface that is coplanar with a topmost surface of the semiconductor material portion 14P. In other embodiments, the dielectric material portion 18P may have a topmost surface that located above or below the topmost surface of the semiconductor material portion 14P.

In some embodiments, the semiconductor material portion 14P is itself a semiconductor fin. As used herein, a "fin" refers to a contiguous structure including a semiconductor material and including a pair of vertical sidewalls that are parallel to each other. As used herein, a surface is "vertical" if there exists a vertical plane from which the surface does not deviate by more than three times the root mean square roughness of the surface. In other embodiments, the semiconductor material portion 14P can be processed at a later stage of the present application into at least one semiconductor fin.

The dielectric material portion 18P can include any dielectric material including for example, a semiconductor oxide, a semiconductor nitride, a semiconductor oxynitride, a dielectric metal oxide or mulitayered combinations thereof. In some embodiments of the present application, the dielectric material portion 18P may comprise a same dielectric material as insulator layer 12. In one example, the dielectric material portion 18P and the insulator layer 12 both comprise silicon dioxide. In such an embodiment, there would be no material interface between the dielectric material portion 18P and the underlying portion of the insulator layer 12. In other embodiments of the present application, the dielectric material portion 18P and the insulator layer 12 comprise different dielectric materials. In one example, the dielectric material portion 18P comprises silicon nitride, while the insulator layer 12 comprises silicon dioxide. In such an embodiment, a material interface would exist between the dielectric material portion 18P and the underlying portion of the insulator layer 12.

In one embodiment of the present application, the dielectric material that provides the dielectric material portion 18P can be formed utilizing a deposition process such as, for example, chemical vapor deposition (CVD) or plasma enhanced chemical vapor deposition (PECVD). In other embodiments, the dielectric material that provides the dielectric material portion 18P can be formed by a thermal process such as, for example, thermal oxidation and/or thermal nitridation. In yet other embodiments, the dielectric material that provides the dielectric material portion 18P can be formed by a combination of a deposition process and a thermal process. In some embodiments of the present application, a planarization process such as, for example, chemical mechanical planarization and/or grinding, can be used to provide a dielectric material structure 18P having a topmost surface that is coplanar with a topmost surface of the semiconductor material portion 14P.

Figure 4:
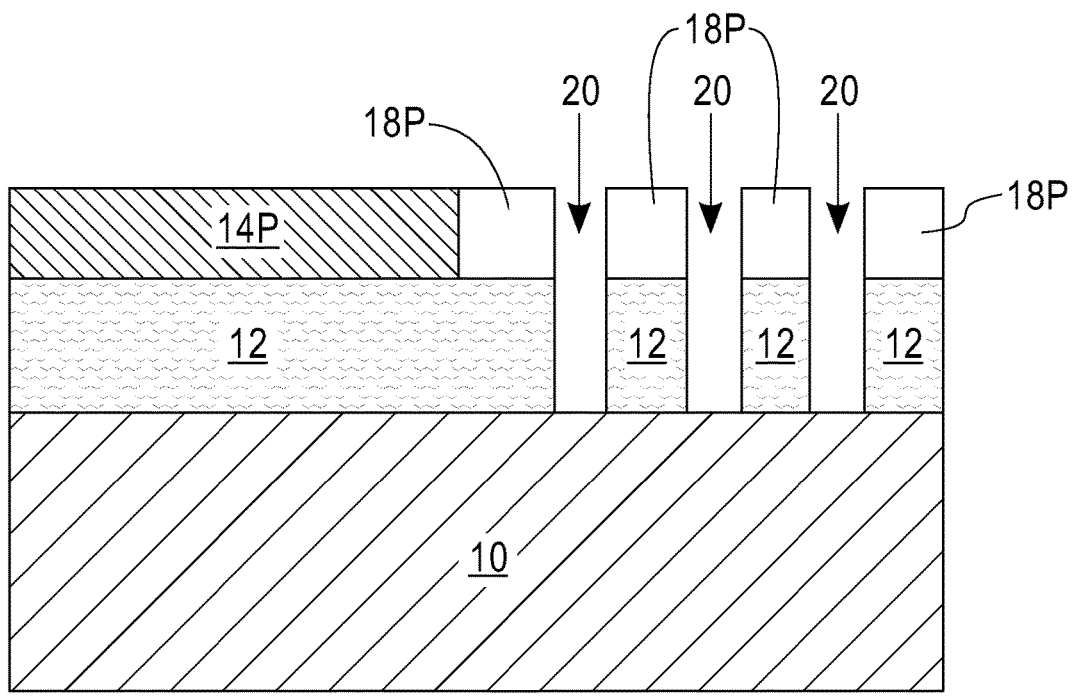
FIG. 4 is a cross sectional view of the exemplary semiconductor structure of FIG. 3 after forming a plurality of trenches entirely through the dielectric material portion and entirely through the underlying portion of insulator layer.

Referring now to FIG. 4, there is illustrated the exemplary semiconductor structure of FIG. 3 after forming a plurality of trenches 20 entirely through the dielectric material portion 18P and entirely through the underlying portion of insulator layer 12. As is shown, each trench 20 of the plurality of trenches 20 exposes a portion of the topmost surface of handle substrate 10. Each trench 20 that is formed has vertical sidewalls. Each trench 20 has a least one vertical sidewall that is surrounded by a remaining portion of the dielectric material portion 18P.

Each trench 20 can be formed utilizing a patterning process. In one embodiment of the present application, each trench 20 can be formed by lithography (as described above) and etching (as described above). A single etch or multiple etching processes can be used. The patterned photoresist can be removed after pattern transfer by utilizing a conventional resist stripping process such as, for example, ashing.

In another embodiment of the present application, each trench 20 can be formed by a sidewall image transfer (SIT) process. The SIT process includes forming a contiguous mandrel material layer (not shown) on the topmost surface of the structure. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the surface of at least the dielectric material portion 18P; mandrel structures can also be formed atop the semiconductor material portion 14P and can be used to cut the semiconductor material portion or form semiconductor fins as desired.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD).

Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material as compared to the material of the dielectric spacers and dielectric material portion 18P. Following the mandrel structure removal, the SIT process continues by transferring the pattern provided by the dielectric spacers into the dielectric material portion 18P and then into the insulator layer 12. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Each trench 20 that is formed has a high aspect ratio. By "high aspect ratio" it is meant a width to height ratio of at greater than 1:2. In some embodiments, the aspect ratio of each trench 20 is from 1:5 to 1:10. Other aspect ratios are possible, as long as the aspect ratio is greater enough to trap defects within a bottom portion of the trench.

In some embodiments of the present application, each trench 20 has a width that is 20 nm or less. In such embodiment, each trench 20 can be used as a fin forming trench. By "fin forming trench" it is meant an opening in which a semiconductor fin can be subsequently formed. In other embodiments, each trench 20 has a width that is greater than 20 nm and up to 100 nm. In such an embodiment, each trench 20 forms a fin forming precursor trench. By "fin forming precursor trench" it is meant an opening in which a semiconductor material can be formed and latter patterned into a semiconductor fin by, for example, employing the SIT process mentioned above.

Figure 5:
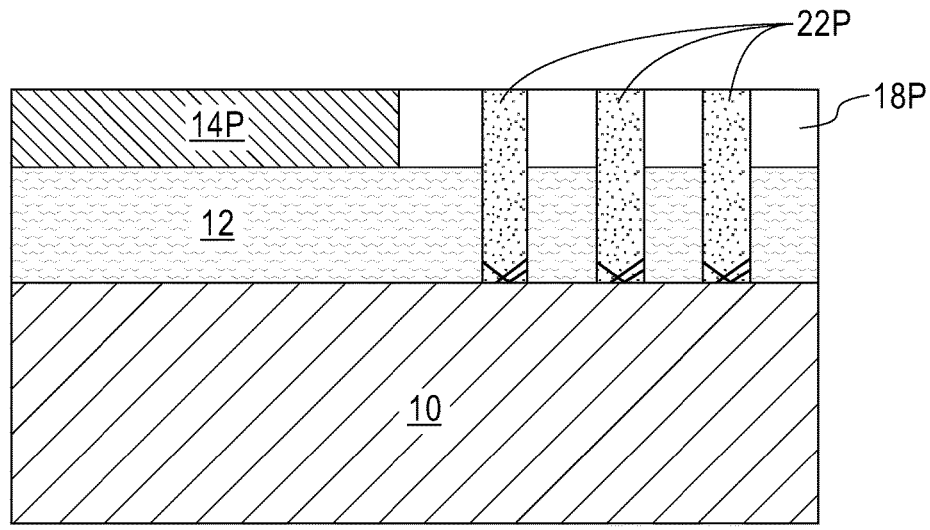
FIG. 5 is a cross sectional view of the exemplary semiconductor structure of FIG. 4 after forming an III-V compound semiconductor pillar in each trench.

Referring now to FIG. 5, there is illustrated the exemplary semiconductor structure of FIG. 4 after forming an III-V compound semiconductor pillar 22P in each trench 20. By "III-V compound semiconductor" it is meant a semiconductor that includes at least one element from Group III of the Periodic Table of Elements (e.g., one of Al, Ga or In) and at least one element from Group V of the Periodic Table of Elements (e.g., one of N, P, As or Sb). Examples of III-V compound semiconductors include GaAs, GaP, GaN, GaInP, GaAs, InP, or InAs. During formation of the III-V compound semiconductor pillars, a block mask (not shown) is formed atop the region of the structure including the semiconductor material portion 14P. Each III-V compound semiconductor pillar 22P has a bottommost surface that is in direct contact with an exposed portion of the topmost surface of handle substrate 10. Each III-V compound semiconductor pillar 22P also has sidewall surfaces that directly contact sidewall surfaces of the remaining dielectric material portion 18P and remaining portions of insulator 12. In some embodiments, and as shown, each III-V compound semiconductor pillar 22P has a topmost surface that is coplanar with a topmost surface of the remaining portions of the dielectric material portion 18P and a topmost surface of the semiconductor material portion 14P. In other embodiments, each III-V compound semiconductor pillar 22P may have a topmost surface that extends above or below the topmost surface of at least the remaining portions of the dielectric material portion 18P. Each III-V compound semiconductor pillar 22P has a lower portion (indicated by " x " in the drawings) having a first defect density and an upper portion (not including the "x") having a second defect density that is less than the first defect density.

Each III-V compound semiconductor pillar 22P that is provided can be formed utilizing an epitaxial semiconductor regrowth process such as is described, for example, in U.S. Patent Application Publication No. 2011/0049568 to Lochtefeld et al., the entire content and disclosure of which is incorporated herein by reference. Notably, and since an epitaxial semiconductor regrowth process is used, each III-V compound semiconductor pillar 22P has a same crystalline characteristic as the semiconductor material of the deposition surface. Thus, in the present application, each III-V compound semiconductor pillar 22P has an epitaxial relationship, i.e., same crystal orientation, with the underlying handle substrate 10.

In some embodiments of the present application, the selected crystallographic direction of each III-V compound semiconductor pillar 22P is aligned with at least one propagation direction of threading dislocations in the opening in which each III-V compound semiconductor pillar 22P is formed. Threading dislocations in this region may substantially terminate at the sidewall of the neighboring remaining portions of the insulator layer 12. In some embodiments, the selected crystallographic direction of each III-V compound semiconductor pillar 22P is substantially aligned with a <100> crystallographic direction of the handle substrate 10. In other embodiments, the selected crystallographic direction of each III-V compound semiconductor pillar 22P is substantially aligned with a <110> crystallographic direction of the handle substrate 10.

Each III-V compound semiconductor pillar 22P can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas may include at least one precursor gas and a carrier gas, such as, for example hydrogen. Any precursor gas or mixture of gases that can form a III-V compound semiconductor material can be used in the present application. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

In some embodiments of the present application, and after the selective epitaxial growth of the III-V compound semiconductor material that provides each III-V compound semiconductor pillar 22P, a planarization process such as, for example, chemical mechanical planarization and/or grinding can be used to provide the structure shown in FIG. 5.

In some embodiments, each III-V compound semiconductor pillar 22P itself may represent an III-V compound semiconductor fin. In other embodiments, each III-V compound semiconductor pillar 22P can be patterned by a SIT process (or lithography and etching) to provide an III-V compound semiconductor fin.

As mentioned above, the semiconductor material portion 14P can also itself represent a semiconductor fin. In other embodiments, the semiconductor material portion 14P can be patterned by a SIT process (or lithography and etching) to provide a semiconductor fin.

In accordance with the present application, each semiconductor fin that is derived from the semiconductor material portion 14P has a bottommost surface that directly contacts a topmost surface of the insulator layer 12, and each III-V compound semiconductor fin that is derived from the III-V compound semiconductor pillar 22P has a bottommost surface that directly contacts a topmost surface of handle substrate 10.

Figure 6:
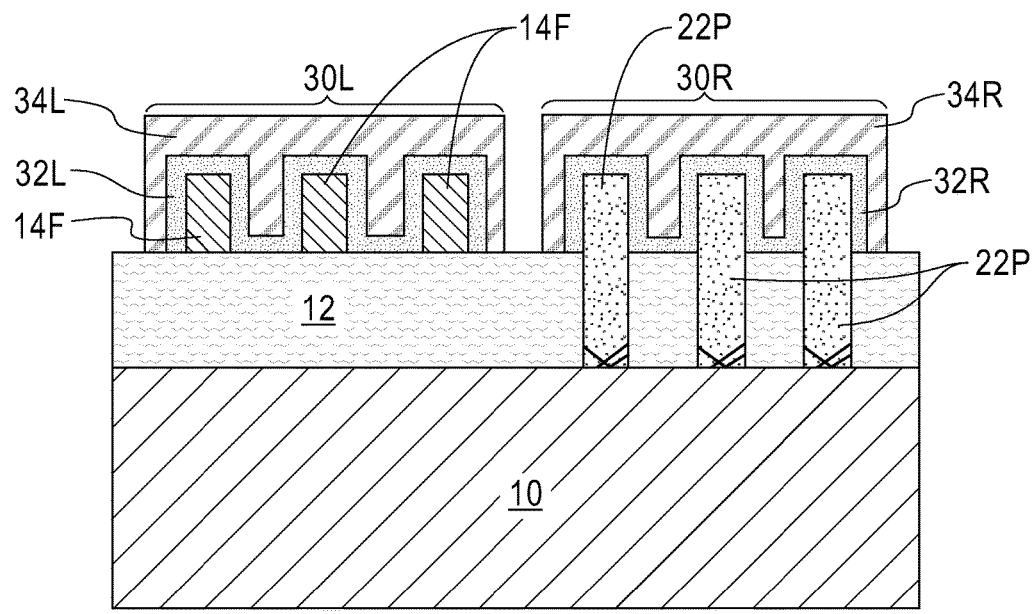
FIG. 6 is a cross sectional view of the exemplary semiconductor structure of FIG. 5 after exposing a top portion of each III-V compound semiconductor pillar, cutting the semiconductor material portion and forming functional gate structures.

Referring now to FIG. 6, there is illustrated the exemplary semiconductor structure of FIG. 5 after exposing a top portion of each III-V compound semiconductor pillar 22P, cutting the semiconductor material portion 14P and forming functional gate structures 30L, 30R. In this embodiment of the present application, the top portion of each III-V compound semiconductor pillar 22P represents an III-V semiconductor fin. Also, and in this embodiment, each cut semiconductor material portion 14P provides a semiconductor fin 14F. A SIT process can be used to cut the semiconductor material portion.

The exposing of a top portion of each III-V compound semiconductor pillar 22P can be performed utilizing an etch back process that selectively removes dielectric material relative to semiconductor material. In some embodiments, a portion of dielectric material portion 18P may remain in the structure.

By "functional gate structure" it is meant a permanent gate structure used to control output current (i.e., flow of carriers in the channel) of a semiconducting device through electrical or magnetic fields. Each functional gate structure 30L, 30R that is formed includes a gate material stack of, from bottom to top, a gate dielectric portion 32L, 32R, and a gate conductor portion 34L, 34R. In some embodiments (not shown), a gate cap portion can be present atop each gate conductor portion 34L, 34R.

Each gate dielectric portion 32L, 32R comprises a dielectric material. The gate dielectric material that provides each gate dielectric portion 32L, 32R can be an oxide, nitride, and/or oxynitride. In one example, the gate dielectric material that provides each gate dielectric portion 32L, 32R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion 32L, 32R.

The gate dielectric material used in providing each gate dielectric portion 32L, 32R can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of each gate dielectric portion 32L, 32R. In some embodiments, each gate dielectric portion comprises a same gate dielectric material. In other embodiments, gate dielectric portion 32L may comprise a first gate dielectric material, while gate dielectric portion 32R may comprise a second gate dielectric material that differs in composition from the first gate dielectric material. When a different gate dielectric material is used for the gate dielectric portions 32L, 32R, block mask technology can be used. In one embodiment of the present application, the gate dielectric material used in providing each gate dielectric portion 32L, 32R can have a thickness in a range from 1 nm to 10 nm. Other thicknesses that are lesser than, or greater than, the aforementioned thickness range can also be employed for the gate dielectric material.

Each gate conductor portion 34L, 34R comprises a gate conductor material. The gate conductor material used in providing each gate conductor portion 34L, 34R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 34L, 34R may comprise an nFET gate metal. In other embodiments, each gate conductor portion 34L, 34R may comprise a pFET gate metal. In yet other embodiments, gate conductor portion 34L comprises an nFET gate metal, while gate conductor portion 34R comprises a pFET gate metal. In yet another embodiment, gate conductor portion 34L comprises a pFET gate metal, while gate conductor portion 34R comprises an nFET gate metal.

The gate conductor material used in providing each gate conductor portion 34L, 34R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions 34L, 34R, block mask technology can be used. In one embodiment, the gate conductor material used in providing each gate conductor portion 34L, 34R has a thickness from 1 nm to 100 nm. Other thicknesses that are lesser than, or greater than, the aforementioned thickness range can also be employed for the gate conductor material used in providing each gate conductor portion 34L, 34R.

Each gate cap portion comprises a gate cap material. The gate cap material that provides each gate cap portion may include a hard mask material such as, for example, silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure 30L, 30R can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application (not shown), sacrificial gate structures are first formed. By sacrificial gate structure" it is meant a material or material stack that serves as a placeholder for a subsequently formed functional gate structure. In such an embodiment, the gate dielectric portion of the functional gate structures may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portions of the functional gate structures. The sacrificial gate material portion includes one of the gate conductor materials mentioned above for gate conductor portions of the functional gate structures. The sacrificial gate dielectric portion includes one of the gate cap material mentioned above for gate cap portions of the functional gate structures. The sacrificial gate structures can be formed by deposition of the various material layers and then patterning the resultant sacrificial material sack by utilizing, for example, lithography and etching. The sacrificial gate structures are replaced after forming source/drain regions.

Source/drain regions (not shown) are formed in exposed portions of the semiconductor fin and III-V semiconductor fins that are not covered by either the functional gate structures or the sacrificial gate structures; in the drawing the source/drain regions would be located in front of the plane of the drawing and behind the plane of the drawing. The source/drain regions can be formed utilizing conventional techniques such as, for example, epitaxial growth, that are well known to those skilled in the art. As is known, the source region would be located on one side of each functional gate structure and the drain region would be located on another side of each functional gate structures. In some embodiments, the source/drain regions can be unmerged. In yet other embodiments, the source/drain regions can be merged.

Figure 7:
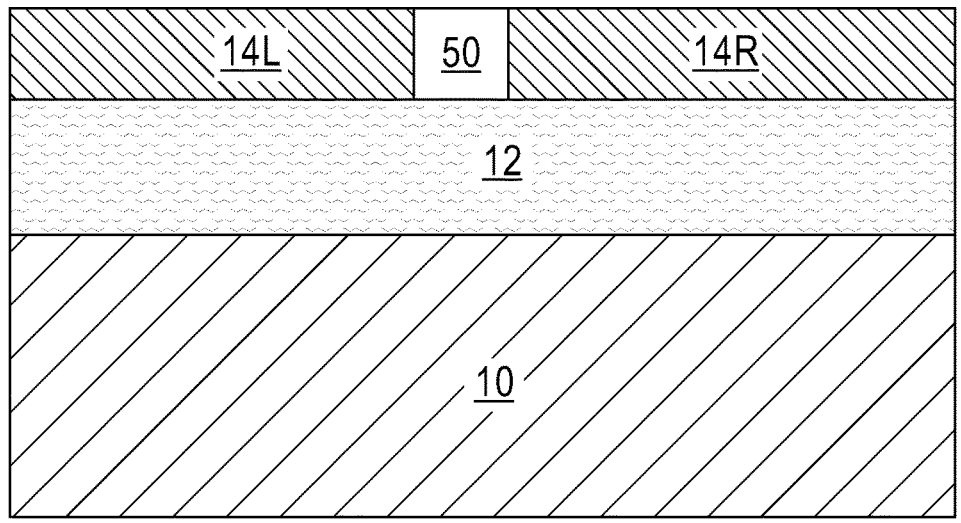
FIG. 7 is a cross sectional view of the exemplary semiconductor structure of FIG. 1 after forming a trench isolation structure within the top semiconductor layer in accordance with another embodiment of the present application.

Referring now to FIG. 7, there is illustrated the exemplary semiconductor structure of FIG. 1 after forming a trench isolation structure 50 within the top semiconductor layer 14 in accordance with another embodiment of the present application. The remaining portions of the top semiconductor layer can be referred to here as semiconductor material portions 14R and 14L. The trench isolation structure 50 can be formed utilizing a conventional trench isolation process that is well known to those skilled in the art. For example, lithography and etching can be used to define a trench in the top semiconductor layer 14. The trench that is provided can then be filled with a trench dielectric material such as, for example, an oxide. Optionally, a liner can be formed in the trench prior to trench fill. In some embodiments, a densification step may be performed after the trench fill. In yet a further embodiment, a planarization process may follow the trench fill.

Figure 8:
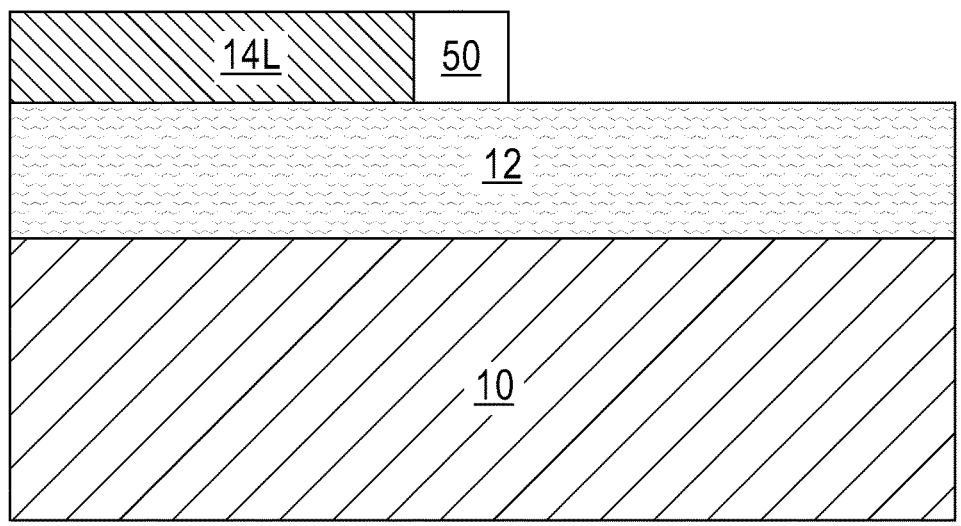
FIG. 8 is a cross sectional view of the exemplary semiconductor structure of FIG. 7 after removing a semiconductor material portion of the top semiconductor layer located on one side of the trench isolation structure, while leaving another semiconductor material portion of the top semiconductor layer on the other side of the trench isolation structure.

Referring now to FIG. 8, there is illustrated the exemplary semiconductor structure of FIG. 7 after removing the semiconductor material portion 14R located on one side of the trench isolation structure 50, while leaving the semiconductor material layer portion 14L on the other side of the trench isolation structure 50. The removal of the semiconductor material portion 14R can be performed as described above in providing the structure shown in FIG. 2 of the present application.

Figure 9:
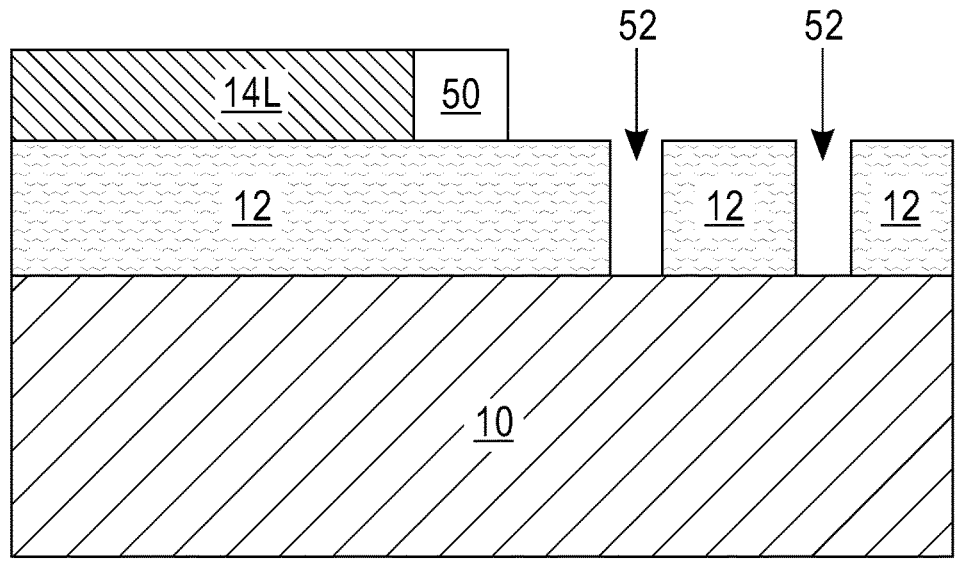
FIG. 9 is a cross sectional view of the exemplary semiconductor structure of FIG. 8 after forming a plurality of trenches that extend entirely through the exposed portion of the insulator layer.

Referring now to FIG. 9, there is illustrated the exemplary semiconductor structure of FIG. 8 after forming a plurality of trenches 52 that extend entirely through the exposed portion of the insulator layer 12. Trenches 52 can be formed utilizing one of the patterning techniques mentioned above in forming trenches 20.

Each trench 52 that is formed has a high aspect ratio. By "high aspect ratio" it is meant a width to height ratio of at greater than 1:2. In some embodiments, the aspect ratio of each trench 52 is from 1:5 to 1:10. Other aspect ratios are possible, as long as the aspect ratio is greater enough to trap defects within a bottom portion of the trench.

In some embodiments of the present application, each trench 52 has a width that is 20 nm or less. In such embodiment, each trench 52 can be used as a fin forming trench. In other embodiments, each trench 52 has a width that is greater than 20 nm and up to 100 nm. In such an embodiment, each trench 52 forms a fin forming precursor trench.

Figure 10:
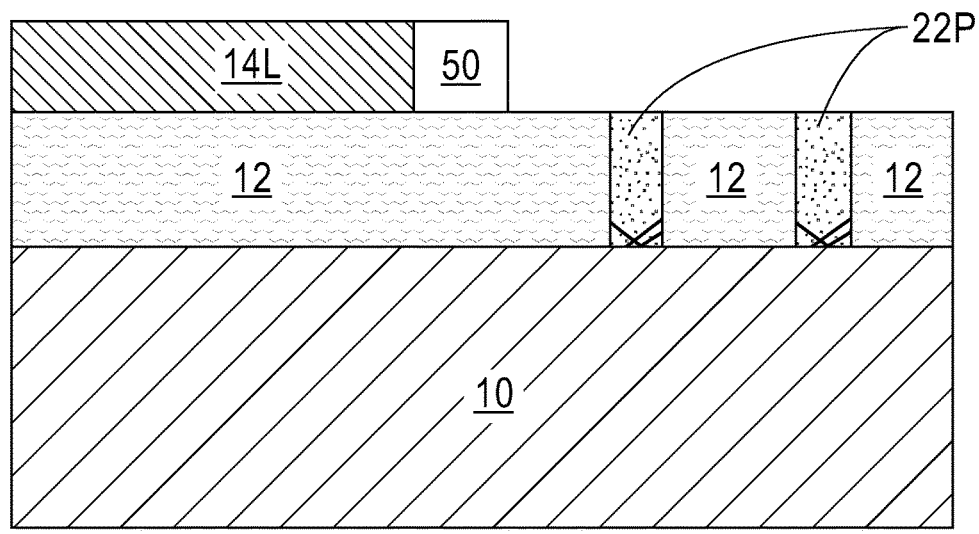
FIG. 10 is a cross sectional view of the exemplary semiconductor structure of FIG. 9 after forming an III-V compound semiconductor pillar within each of the trenches.

Referring now to FIG. 10, there is illustrated the exemplary semiconductor structure of FIG. 9 after forming an III-V compound semiconductor pillar 22P within each of the trenches 52. Each III-V compound semiconductor pillar 22P has a lower portion (indicated by " x" in the drawings) having a first defect density and an upper portion (not including the "x") having a second defect density that is less than the first defect density. Each III-V compound semiconductor pillar 22P that is provided can be formed utilizing an epitaxial semiconductor regrowth process as described above in providing the III-V compound semiconductor structures to the structure shown in FIG. 5. In the illustrated embodiment, each III-V compound semiconductor pillar 22P is surrounded by remaining portions of the insulator layer 12.

Figure 11:
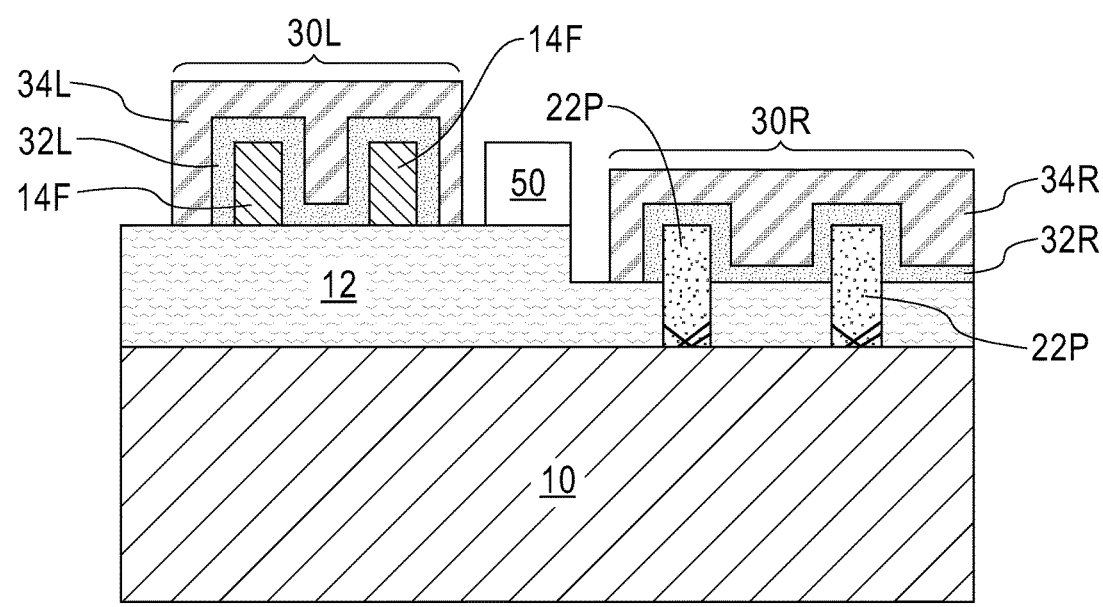
FIG. 11 is a cross sectional view of the exemplary semiconductor structure of FIG. 10 after exposing a top portion of each III-V compound semiconductor pillar, cutting the semiconductor material portion and forming functional gate structures.

Referring now to FIG. 11, there is illustrated the exemplary semiconductor structure of FIG. 10 exposing a top portion of each III-V compound semiconductor pillar 22P, cutting by a SIT process the semiconductor material portion 14L to provide semiconductor fins 14F and forming functional gate structures 30L, 30R. The materials and various methods mentioned above in forming the functional gate structures to the structure shown in FIG. 6 apply here for forming the structure shown in FIG. 11.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, comprising:
    providing a semiconductor-on-insulator (SOI) substrate that includes, from bottom to top, a silicon or germanium handle substrate that is miscut from 2 degrees to 8 degrees towards the <111> crystallographic direction or the <100> crystallographic direction, an insulator layer and a top semiconductor layer;
    removing said top semiconductor layer from one region of the SOI substrate to expose a portion of said insulator layer, while maintaining a portion of said top semiconductor layer in another region of said SOI substrate;
    forming a trench in said exposed portion of said insulator layer of the SOI substrate; and epitaxially growing an III-V compound semiconductor pillar in said trench, wherein said III-V compound semiconductor pillar comprises a lower portion that has a first defect density and an upper portion that has a second defect density that is less than said first defect density.

2. The method of claim 1, wherein said trench is formed along said <111> crystallographic direction of said handle substrate.

3. The method of claim 1, wherein said trench is formed along said <100> crystallographic direction of said handle substrate.

4. The method of claim 1, wherein prior to forming said trench, a dielectric material portion is formed on said exposed portion of said insulator layer, and said trench is also formed entirely through said dielectric material portion.

5. The method of claim 4, wherein said dielectric material portion and said insulator layer comprise a same dielectric material, and said dielectric material portion has a topmost surface that is coplanar with a topmost surface of said portion of said top semiconductor layer that remains in said another region of said SOI substrate.

6. The method of claim 4, wherein said dielectric material portion and said insulator layer comprise a different, and said dielectric material portion has a topmost surface that is coplanar with a topmost surface of said portion of said top semiconductor layer that remains in said another region of said SOI substrate.

7. The method of claim 1, wherein prior to removing said top semiconductor layer from one region of said SOI substrate, a trench isolation structure is formed in said top semiconductor layer.

8. The method of claim 1, wherein said trench has an aspect ratio of greater than 1:2.

9. The method of claim 1, wherein defects within said bottom portion of said trench propagate to a sidewall of said trench.

10. The method of claim 1, further comprising exposing a top sidewall portion of said III-V compound semiconductor pillar, cutting said semiconductor material portion, and forming a first functional gate structure on an exposed portion of said III-V compound semiconductor pillar and a second functional gate structure on an exposed portion of each cut semiconductor material portion.

11. The method of claim 1, wherein said silicon or germanium handle substrate has a terraced surface.

12. The method of claim 1, wherein said removing said top semiconductor layer comprises patterning said top semiconductor material by lithography and etching.

13. The method of claim 1, wherein said portion of said top semiconductor layer in said another region of said SOI substrate comprises a semiconductor fin.

14. The method of claim 1, wherein said forming said trench comprises a patterning process.

15. The method of claim 1, further comprises performing a planarization process following said epitaxial growth of said III-V compound semiconductor pillar.

16. The method of claim 1, wherein said III-V compound semiconductor pillar is substantially aligned with said <100> crystallographic direction of said handle substrate.

17. The method of claim 1, wherein said III-V compound semiconductor pillar is substantially aligned with a <110> crystallographic direction of said handle substrate.

18. The method of claim 1, wherein said III-V compound semiconductor pillar has a width of 20 nm or less.

* * * * *